(12) United States Patent
Kim et al.

(10) Patent No.: US 7,120,857 B2
(45) Date of Patent: Oct. 10, 2006

(54) LDPC DECODING APPARATUS AND METHOD

(75) Inventors: Ki-hyun Kim, Seongnam-si (KR); In-sik Park, Suwon-si (KR); Jae-seong Shim, Seoul (KR); Sung-hyu Han, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 526 days.

(21) Appl. No.: 10/670,779

(22) Filed: Sep. 26, 2003

(65) Prior Publication Data

US 2004/0153959 A1    Aug. 5, 2004

(30) Foreign Application Priority Data

Oct. 26, 2002  (KR)  .................... 10-2002-0065658

(51) Int. Cl.
G06F 11/00   (2006.01)
H03M 13/00   (2006.01)

(52) U.S. Cl. ..................................................... 714/801
(58) Field of Classification Search ........ 714/800–801, 714/807

See application file for complete search history.

(56) References Cited

U.S. PATENT DOCUMENTS 6,950,461 B1 *  9/2005  Goldstein et al. ........... 375/222
7,000,177 B1 *  2/2006  Wu et al. .................... 714/801

* cited by examiner

*Primary Examiner*—Shelly Chase

(74) *Attorney, Agent, or Firm*—Stein, McEwen & Bui, LLP

(57) ABSTRACT

An LDPC decoding method and apparatus of LDPC decoding a codeword formed by c code bits transmitted through a channel include receiving the codeword and a p×c parity check matrix formed of 0 and 1 values, comparing the codeword with each of p rows of the parity check matrix, the rows formed with c elements, generating an R matrix by obtaining a first minimum value that is a minimum value among elements that are not 0 in each row, a second minimum value that is a second smallest value in the same row, and a location of the first minimum value, and outputting a decoded codeword formed by c code bits by determining one code bit by adding elements of each column of the R matrix.

28 Claims, 7 Drawing Sheets

$$P = \begin{bmatrix} 0.268 & 0.881 & 0.119 & 0.119 & 0.881 & 0.5 \end{bmatrix}$$

$$H = \begin{bmatrix} 1 & 1 & 0 & 1 & 0 & 0 \\ 0 & 1 & 1 & 0 & 1 & 0 \\ 1 & 0 & 1 & 0 & 0 & 1 \end{bmatrix}$$

$$Q = \begin{bmatrix} 0.268 & 0.881 & 0 & 0.119 & 0 & 0 \\ 0 & 0.881 & 0.119 & 0 & 0.881 & 0 \\ 0.268 & 0 & 0.119 & 0 & 0 & 0.5 \end{bmatrix}$$

FIG. 3C $$R' = \begin{bmatrix} 0.119 & 0.119 & 0 & 0.268 & 0 & 0 \\ 0 & 0.119 & 0.881 & 0 & 0.119 & 0 \\ 0.119 & 0 & 0.268 & 0 & 0 & 0.119 \end{bmatrix}$$

FIG. 3D $$R = \begin{bmatrix} -0.119 & -0.119 & 0 & -0.268 & 0 & 0 \\ 0 & -0.119 & -0.881 & 0 & -0.119 & 0 \\ -0.119 & 0 & -0.268 & 0 & 0 & -0.119 \end{bmatrix}$$

FIG. 3E $$Q' = \begin{bmatrix} 0.149 & 0.762 & 0 & 0.119 & 0 & 0 \\ 0 & 0.762 & -0.149 & 0 & 0.881 & 0 \\ 0.149 & 0 & -0.762 & 0 & 0 & 0.5 \end{bmatrix}$$

LDPC DECODING APPARATUS AND METHOD

CROSS-REFERENCE TO RELATED APPLICATIONS

This application claims the priority of Korean Patent Application No. 2002-65658, filed on Oct. 26, 2002, in the Korean Intellectual Property Office, the disclosure of which is incorporated herein in its entirety by reference.

BACKGROUND OF THE INVENTION

1. Field of the Invention

The present invention relates to an error correction decoding apparatus and method, and more particularly, to a decoding apparatus and method which improve decoding performance by reducing a complexity when implementing a low density parity code (LDPC) decoding algorithm.

2. Description of the Related Art

A low density parity code (LDPC) encoding method is an error correction coding technique used in wireless communications and optical recording and/or reproducing fields. LDPC encoding includes a process to generate parity information (additional information) by using a parity check matrix in which the same number of elements whose values are 1 are included in each row and column, and the values of other elements are 0. That is, the parity information is determined to satisfy equation 1 below:

$$H \cdot C = 0 \qquad (1)$$

Here, H denotes a p×c parity check matrix, and 0 is a zero matrix. C is a column matrix having elements of a c-bit codeword. The c-bit codeword includes an m-bit message word, $k_1, k_2, \ldots, k_m$, and p-bit parity information, $x_1, x_2, \ldots, x_p$. Among the elements of the parity check matrix H and the column matrix C, the message word that is the object of encoding is already known and therefore, parity information $x_i$ (i=1, 2, . . . , p) can be determined using equation 1.

A detailed description of the LDPC encoding is disclosed in an article, "Good Error Correction Codes Based on Very Sparse Matrices" (D. J. MacKay, IEEE Trans. on Information Theory, vol. 45, No. 2, pp.399–431, 1999).

When a codeword having an error is LDPC encoded, which is transmitted through a channel and decoded, the parity check matrix that is used in the encoding is used for decoding. During the decoding, a great number of matrix computations are needed. Among the computations, there is a process in which one element in each row of the matrix is replaced by a value obtained by multiplying remaining element values in the same row excluding a value of the element. The multiplication increases complexity in implementing a system.

A technique has been suggested for an LDPC decoding algorithm without performing multiplications of matrix elements that increase system complexity. According to the technique, instead of multiplication operations, operations to replace the element of each row of the matrix with a minimum value among the element values of the row excluding the element value are performed and almost the same result could be obtained. A detailed description of this technique is described in an article, "Reduced Complexity of Iterative Decoding of Low Density Parity Check Codes Based on Belief Propagation" (M. Fossorier, M. Mihailjevic, and H. Imai, IEEE Trans. on Communications, vol. 47, No. 5, pp. 673–680,1999).

However, even in the technique of replacing the multiplication operations, the operation to obtain the minimum value among a plurality of the elements in each row should be repeated with a frequency corresponding to the number of elements of the matrix such that complexity increases.

SUMMARY OF THE INVENTION

To solve the above and/or other problems, according to an aspect of the present invention, there is provided an LDPC decoding apparatus and method to reduce a complexity of operations and improve decoding performance when a codeword that is LDPC encoded and transmitted through a channel is decoded using a parity check matrix.

Additional aspects and advantages of the invention will be set forth in part in the description which follows and, in part, will be obvious from the description, or may be learned by practice of the invention.

According to an aspect of the present invention, there is provided an LDPC decoding apparatus which performs LDPC decoding of a codeword formed of c code bits transmitted through a channel, the apparatus including a first Q matrix generation unit receiving the codeword and a p×c parity check matrix formed of 0 and 1 values, comprising the codeword with each of p rows of the parity check matrix formed of c elements, replacing the element having a value of 1 in each of the p rows with a code bit value in a location of the codeword corresponding to the location of the c element, and generating a first Q matrix; an R matrix generation unit receiving the first Q matrix from the first Q matrix generation unit, and by using a first minimum value that is a minimum value among the elements that are not 0 in each row, a second minimum value that is a second minimum value in the same row, and the location of the first minimum value in each row of the first Q matrix, replacing the element that is not 0 in the row with the minimum value, among the remaining elements that are not 0 in the row excluding the value of the element, and generating an R matrix; a second Q matrix generation unit receiving the codeword and the R matrix from the R matrix generation unit, generating a second Q matrix by replacing each non-zero element in the R matrix with a value obtained by adding all non-zero elements in the column having the non-zero element being replaced, except the non-zero element which is being replaced, and the element in the same column of the codeword, and outputting the second Q matrix to the R matrix generation unit; and an output calculation unit receiving the R matrix from the R matrix generation unit and by determining one code bit by adding elements of each column of the R matrix, outputting a decoded codeword formed by the c code bits, wherein the R matrix generation unit receives the second Q matrix from the second Q matrix generation unit, generates a second R matrix and outputs the second R matrix to the second Q matrix generation unit and the output calculation unit.

According to another aspect of the present invention, there is provided an LDPC decoding apparatus which performs LDPC decoding of a codeword formed of c code bits having soft values transmitted through a channel, the apparatus including a first Q matrix generation unit receiving the codeword and a p×c parity check matrix formed of 0 and 1 values, comparing the codeword with each of p rows of the parity check matrix formed by c elements, replacing the element having a value of 1 in each p row with a code bit value in a location of the codeword corresponding to a location of the element, and generating a first Q matrix; an R matrix generation unit receiving the first Q matrix from the first Q matrix generation unit, and by using a first minimum value that is a minimum value among the elements that are not 0 in each row, a second minimum value that is a second minimum value in the same row, and a location of the first minimum value in each row of the first Q matrix, replacing the element that is not 0 in the row with the minimum value, and generating an R matrix; an output calculation unit receiving the R matrix from the R matrix generation unit and by determining one code bit by adding elements of each column of the R matrix, outputting a decoded codeword formed by the c code bits; an output determination unit receiving the decoded codeword from the output calculation unit and determining whether to output the decoded codeword by determining whether the decoding of the decoded codeword is successful using a parity check matrix; and a second Q matrix generation unit, according to a control signal from the output determination unit determining that the decoding failed, receiving the codeword and the R matrix from the R matrix generation unit, generating a second Q matrix by replacing each non-zero element in the R matrix with a value obtained by adding all non-zero elements in a column having the non-zero element being replaced, except the non-zero element that is being replaced, and the element in the same column of the codeword P, and outputting the second Q matrix to the R matrix generation unit, wherein the R matrix generation unit receives the second Q matrix from the second Q matrix generation unit, generates a second R matrix and outputs the second R matrix to the second Q matrix generation unit and the output calculation unit, and the output calculation unit outputs to the output determination unit the codeword decoded using the second R matrix.

According to another aspect of the present invention, there is provided an LDPC decoding method for LDPC decoding a codeword formed by c code bits transmitted through a channel, the method including receiving the codeword and a p×c parity check matrix formed of 0 and 1 values; comparing the codeword with each of p rows of the parity check matrix, the rows formed with c elements; replacing each element having a value of 1 in each p row with a code bit value in a location of the codeword corresponding to the location of the element; generating a first Q matrix; replacing each element that is not 0 in the row with a minimum value and generating an R matrix by using a first minimum value that is the minimum value among the elements that are not 0 in each row, a second minimum value that is the second minimum value in the same row, and the location of the first minimum value in each row of the first Q matrix; and outputting a decoded codeword formed by c code bits by determining one code bit by adding elements of each column of the R matrix.

According to another aspect of the present invention, there is provided an LDPC decoding method for LDPC decoding a codeword formed by c code bits transmitted through a channel, the method including receiving the codeword and a p×c parity check matrix formed of 0 and 1 values; comparing the codeword with each of p rows of the parity check matrix, the rows formed with c elements; replacing each element having a value of 1 in each p row with a code bit value in a location of the codeword corresponding to the location of the element; generating a first Q matrix; replacing each element that is not 0 in the row with a minimum value and generating an R matrix by using a first minimum value that is the minimum value among the elements that are not 0 in each row, a second minimum value that is the second minimum value in the same row, and the location of the first minimum value in each row of the first Q matrix; calculating a decoded codeword formed with c code bits by determining one code bit by adding elements of each column of the R matrix; and determining whether decoding of the decoded codeword is successful using the parity check matrix, and if the decoding is successful, outputting the decoded codeword.

An LDPC decoding method of LDPC decoding a codeword formed by c code bits transmitted through a channel includes receiving the codeword and a p×c parity check matrix formed of 0 and 1 values, comparing the codeword with each of p rows of the parity check matrix, the rows formed with c elements, generating an R matrix by obtaining a first minimum value that is a minimum value among elements that are not 0 in each row, a second minimum value that is a second smallest value in the same row, and a location of the first minimum value, and outputting a decoded codeword formed by c code bits by determining one code bit by adding elements of each column of the R matrix.

BRIEF DESCRIPTION OF THE DRAWINGS

The above and/or other aspects and advantages of the present invention will become more apparent by describing in detail various aspects thereof with reference to the attached drawings in which:

FIG. 2 is a block diagram illustrating a detailed structure of an R matrix generation unit shown in FIG. 1;

FIGS. 3A through 3E are examples of input/output matrices of respective elements of the LDPC decoding apparatus shown in FIG. 1;

DETAILED DESCRIPTION OF THE PREFERRED EMBODIMENTS

Figure 1:
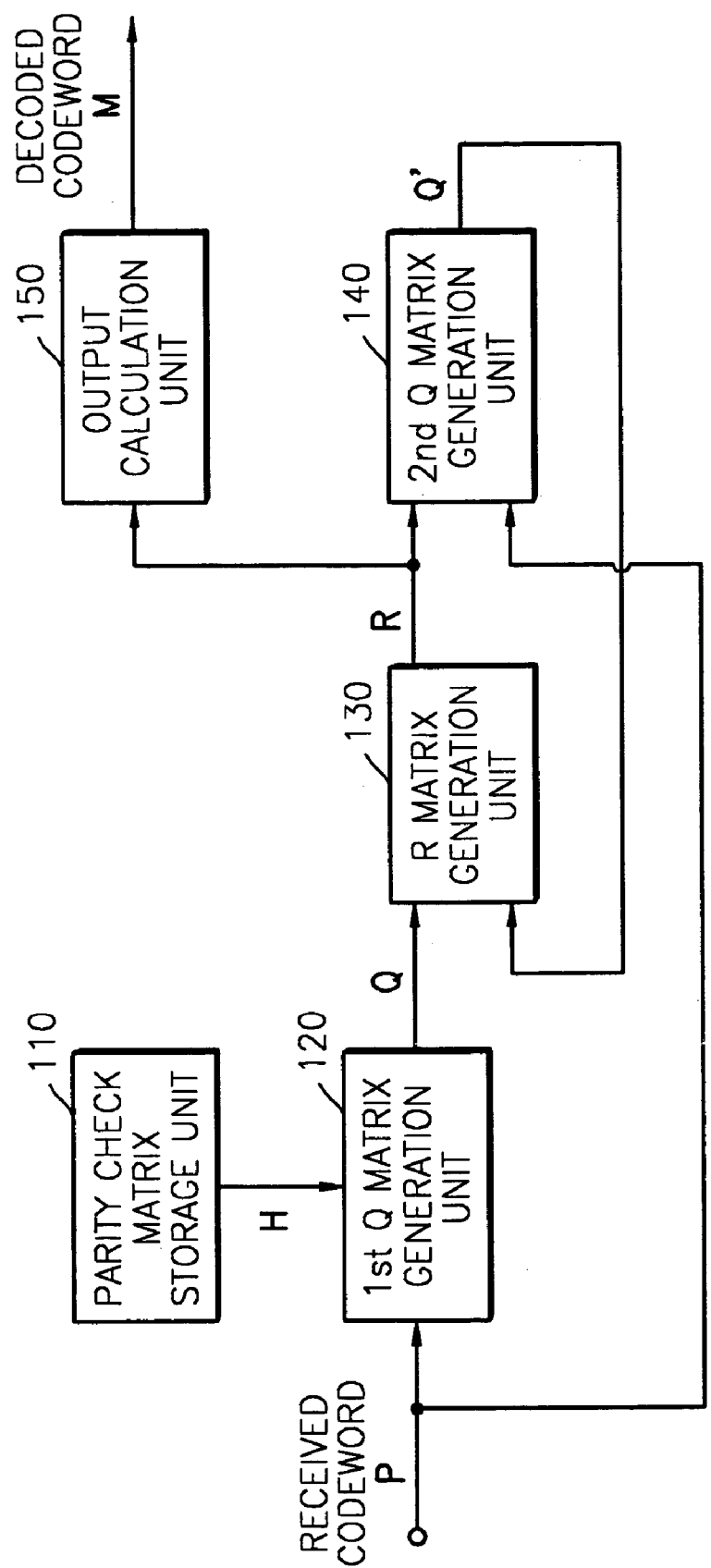
FIG. 1 is a block diagram illustrating an LDPC decoding apparatus, according to the present invention.

Reference will now be made in detail to the present aspects of the present invention, examples of which are illustrated in the accompanying drawings, wherein like reference numerals refer to the like elements throughout. The aspects are described below in order to explain the present invention by referring to the figures.

Referring to FIGS. 1 through 3E, an LDPC decoding apparatus, according to an aspect of the present invention, will now be explained.

FIG. 1 is a block diagram illustrating the LDPC decoding apparatus. Referring to FIG. 1, the LDPC decoding apparatus includes a parity check matrix storage unit 110, a first Q matrix generation unit 120, an R matrix generation unit 130, a second Q matrix generation unit 140, and an output calculation unit 150.

The parity check matrix storage unit 110 stores a parity check matrix H that is used in LDPC coding and provides the matrix H to the first Q matrix generation unit 120.

The first Q matrix generation unit 120 receives a codeword P, which is formed of c code bits having soft values by a variety of noise after being transmitted through a channel, and the parity check matrix H provided by the parity check matrix storage unit 110, and generates Q, a first Q matrix. Here, the term 'soft' indicates that values of the c code bits are not '0' or '1' but analog values distorted by noise, for example, '0.238', '1,376'. While '0' or '1' is referred to as a hard value, '0.238', or '1,376' is referred to as a soft value.

The R matrix generation unit 130 receives the first Q matrix Q from the first Q matrix generation unit 120. Using a first minimum value that is a minimum value among elements that are not 0 in each row, a second minimum value that is a second minimum value in the same row, and a location of the first minimum value, the R matrix generation unit 130 replaces an element that is not 0 in the row with the minimum value among remaining elements that are not 0 in the row excluding the value of the element. The R matrix generation unit 130 then multiplies the value by a predetermined constant so that the R matrix R is generated.

In conventional apparatus, when the R matrix R is generated, a process should be repeated in which the element is replaced by a determined minimum value after determining the minimum value by individually comparing elements that are not 0 excluding the replaced element. However, according to an aspect of the present invention, the first minimum value that is the minimum value among the elements that are not 0 in each row, the second minimum value, which is the second smallest value in the same row, and the location of the first minimum value are first obtained. Then, by using these values, the process to replace each element with the minimum value can be performed faster and more simply.

If the R matrix generation unit 130 receives the second Q matrix Q' from the second Q matrix generation unit 140 after receiving the first Q matrix Q and generating the R matrix R, the R matrix generation unit 130 performs the same operation as in generating the R matrix R for the first Q matrix Q, and generates and outputs another R matrix R.

The second Q matrix generation unit 140 receives the codeword P transmitted through a channel and the matrix R from the R matrix generation unit 130 and generates the second Q matrix Q'.

By determining one code bit by adding elements of each column of matrix R provided by the R matrix generation unit 130, the output calculation unit 150 calculates a decoded codeword M formed by the c code bits and outputs the decoded codeword.

Figures 2, 3A, 3B:
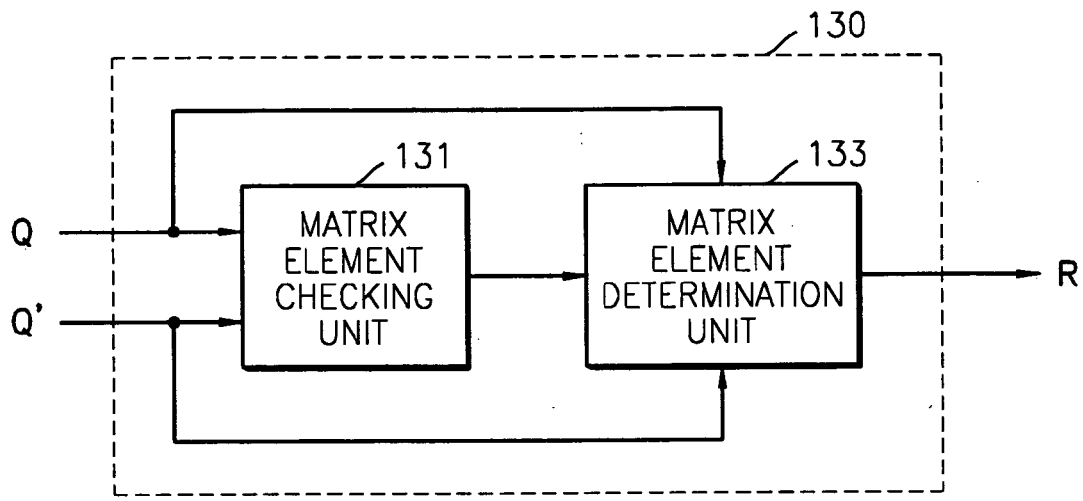

FIG. 2 is a block diagram illustrating a detailed structure of the R matrix generation unit 130 shown in FIG. 1. Referring to FIG. 2, the R matrix generation unit 130 includes a matrix element checking unit 131 and a matrix element determination unit 133.

The matrix element checking unit 131 receives the first Q matrix Q or the second Q matrix Q', and checks elements of each row of the input matrix. The matrix element checking unit 131 determines the first minimum value that is the minimum value among elements that are not 0 in each row, the location of the first minimum value, and the second minimum value, which is the second smallest value, and outputs the determined values to the matrix element determination unit 133. If there are negative numbers among the elements that are not 0 in each row, the absolute values of the negative numbers are taken to determine the first minimum value or the second minimum value.

The matrix element determination unit 133 replaces an element that is not 0 in each row of the input matrix with a value which is the minimum value among elements that are not 0 excluding the element, and multiplies the value by a predetermined constant so that the R matrix R is generated.

The matrix element determination unit 133 receives the first Q matrix Q or the second Q matrix Q', and the first minimum value, the location of the first minimum value, and the second minimum value that is the second smallest value, of each row from the matrix element checking unit 131. If the location of an element of each row of the input matrix is not the location of the first minimum value, the matrix element determination unit 133 replaces the element with the first minimum value and, if the location of the element is the same as the first minimum value, replaces the element with the second minimum value. Thus, the R matrix R is generated.

FIGS. 3A through 3E are examples of input/output matrices of respective elements of the LDPC decoding apparatus shown in FIG. 1.

Referring to FIGS. 3A through 3E, the operation of the LDPC decoding apparatus, according to an aspect of the present invention, will now be explained in detail.

FIG. 3A shows examples of the codeword P which is received through a communications channel and is input to the first Q matrix generation unit 120, and the parity check matrix H stored in the parity check matrix storage unit 110. In the present aspect of the invention, the codeword P is formed by 6 code bits having the soft values. The first 3 code bits are message bits and the next 3 code bits are the parity information. The parity check matrix H is a 3×6 matrix.

FIG. 3B shows the first Q matrix Q which the first Q matrix generation unit 120 generates after receiving the codeword P and the parity check matrix H.

FIGS. 3C and 3D are matrices sequentially generated in the R matrix R generation unit 130.

FIG. 3E shows matrix Q' which the second Q matrix generation unit 140 generates after receiving the codeword P and the parity check matrix H.

The first Q matrix generation unit 120 compares each row of the parity check matrix H, the row formed of 6 elements, with the received codeword P, and replaces the element that has the value of 1 in each row with a code bit value in a location of the codeword corresponding to the location of the element. The first Q matrix generation unit 120 generates the first Q matrix Q as shown in FIG. 3B.

The matrix element checking unit 131 of the R matrix generation unit 130 receives the first Q matrix Q shown in FIG. 3B from the first Q matrix generation unit 120, determines the first minimum value that is the minimum value among elements that are not 0, the second minimum value that is the second smallest value, and the location of the first minimum value in each row of the first Q matrix Q, and outputs the values to the matrix element determination unit 133.

For example, the first minimum value among the element values that are not 0 in the first row of the first Q matrix Q shown in FIG. 3B is 0.119 and is located in a fourth column of the first row. The second minimum value that is the second smallest value is 0.268.

The matrix element determination unit 133 receives the first Q matrix Q, and the first minimum value, the location of the first minimum value, and the second minimum value that is the second smallest value, of each row of the first Q matrix Q input from the matrix element checking unit 131. If the location of the element, among the elements that are not 0, of each row of the first Q matrix Q is not the location of the first minimum value, the matrix element determination unit 133 replaces the element with the first minimum value and, if the location of the element is the same as the first minimum value, replaces the element with the second minimum value so that matrix R' is generated as shown in FIG. 3C.

For example, when the elements of the first row of the first Q matrix Q are input to the matrix element determination unit 133, the elements that are not 0 excluding the element in the fourth column are all replaced by the first minimum value, 0.119. Because the element in the fourth column is the first minimum value, the element is replaced by the second minimum value 0.268.

After generating matrix R' as shown in FIG. 3C, the matrix element determination unit 133 multiplies each element of the matrix R' by the predetermined constant such that the matrix R as shown in FIG. 3D, is generated.

The predetermined constant is determined by equation 2 below:

$$(-1)^{k^*} s \qquad (2)$$

The constant s is a value obtained by multiplying signs of the element values that are not 0 in each row excluding a present element, and k is a value corresponding to the number of elements that are not 0 in each row.

Even when the second Q matrix Q' is input from the second Q matrix generation unit 140, the matrix element checking unit 131 and the matrix element determination unit 133 perform the same operations as in generating matrix R for the first Q matrix Q so that another R matrix R is generated.

The second Q matrix generation unit 140 receives the received codeword P shown in FIG. 3A and the R matrix R shown in FIG. 3D from the R matrix generation unit 130, and replaces an element that is not 0 in each column of the R matrix R with the value obtained by adding the element values that are not 0 excluding the element in the column and a code bit value of the codeword P in the same column as the column of the element in the R matrix R so that the second Q matrix Q' as shown in FIG. 3E. The generated second Q matrix Q' is output to the R matrix generation unit 130.

The R matrix generation unit 130 receives the second Q matrix Q' from the second Q matrix generation unit 140, performs the R matrix generation process described above, and outputs the generated R matrix R to the output calculation unit 150 and the second Q matrix generation unit 140. Therefore, the R matrix generation unit 130 and the second Q matrix generation unit 140 repeatedly perform the R matrix generation operation and the second Q matrix generation operation, respectively, with a predetermined frequency.

By determining one code bit by adding the elements of each column of the R matrix R input from the R matrix generation unit 130, the output calculation unit 150 calculates a decoded codeword M formed by the c code bits. Whenever each of the R matrix Rs is input, the output calculation unit 150 calculates the decoded codeword M, but outputs a decoded codeword for the R matrix R, which is input N-th (N is an integer equal to or greater than 1). That is, the output calculation unit 150 receives the R matrix R, which is generated N-th in the R matrix generation unit 130, decodes the codeword P, and outputs the codeword P. By decoding the codeword P after repeating the R matrix generation operation and the second Q matrix generation operation with the predetermined frequency, error correction capability improves.

Figure 4:
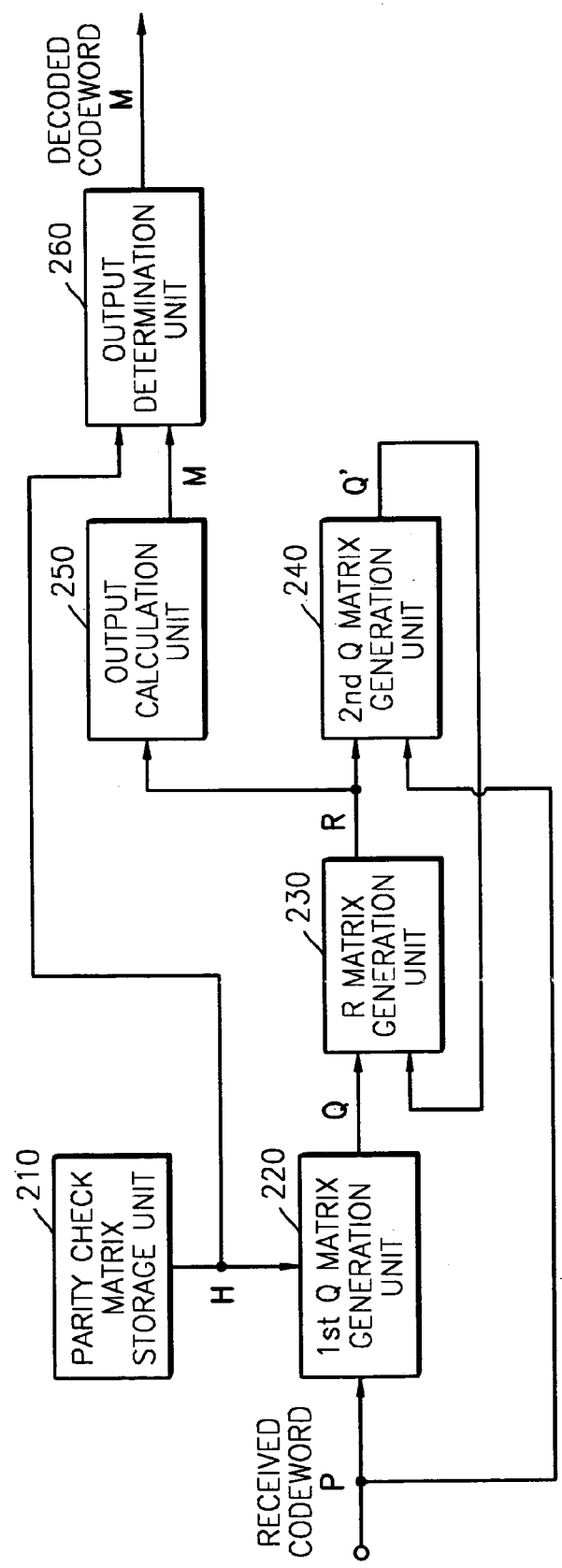
FIG. 4 is a block diagram illustrating the LDPC decoding apparatus, according to another aspect of the present invention.

Referring to FIG. 4, another aspect of the LDPC decoding apparatus will now be explained.

FIG. 4 is a block diagram illustrating another aspect of the LDPC decoding apparatus. Referring to FIG. 4, the LDPC decoding apparatus includes a parity check matrix storage unit 210, a first Q matrix generation unit 220, an R matrix generation unit 230, a second Q matrix generation unit 240, an output calculation unit 250, and an output determination unit 260.

The LDPC decoding apparatus of FIG. 4 is different from the LDPC decoding apparatus shown in FIG. 1 by implementing the second Q matrix generation unit 240 and the output determination unit 260. The parity check matrix storage unit 210, the first Q matrix generation unit 220, the R matrix generation unit 230, and the output calculation unit 250 receive the same inputs, perform the same operations, and generate the same output as the respective corresponding elements in the LDPC decoding apparatus shown in FIG. 1. The R matrix generation unit 230 includes the matrix element checking unit 131 and the matrix element determination unit 133, as shown in FIG. 2.

The second Q matrix generation unit 240 and the output determination unit 260 will now be explained in detail.

First, the output determination unit 260 receives the parity check matrix H from the parity check matrix storage 210 and the decoded codeword M from the output calculation unit 250. By determining whether or not the decoded codeword M is successfully decoded by using the parity check matrix H, the output determination unit 260 determines whether or not to output the decoded codeword M.

The output determination unit 260 outputs the decoded codeword M by determining that the decoding is successful if the following equation 3 is satisfied:

$$H \cdot M = 0 \qquad (3)$$

Here, H denotes a p×c parity check matrix, M denotes a column matrix having elements of the decoded codeword, and 0 is the zero matrix.

Because the codeword with added parity information satisfying the equation 3 is generated in the LDPC encoding, the LDPC decoding apparatus can determine that the decoding is successful if the decoded codeword M satisfies the equation 3 in decoding the codeword.

However, when the decoded codeword M does not satisfy the equation 3 even though the codeword P is decoded after repeatedly performing the decoding process, the frequency of the decoding process should be limited to the predetermined frequency because the decoding cannot be repeated endlessly.

The second Q matrix generation unit 240 performs the same operation as the second Q matrix generation unit 140 shown in FIG. 1 so that the second Q matrix Q' is generated. However, though the second Q matrix generation unit 140 shown in FIG. 1 always generates matrix Q' if the matrix R is input, the second Q matrix generation unit 240 generates the matrix Q' according to a second Q matrix generation control command, which the output determination unit 260 outputs to the second Q matrix generation unit 240 if the output determination unit 260 determines that the decoding has failed.

Referring to FIGS. 1, 2, 5, and 6, an LDPC decoding method, according to an aspect of the present invention will now be explained.

Figure 5:
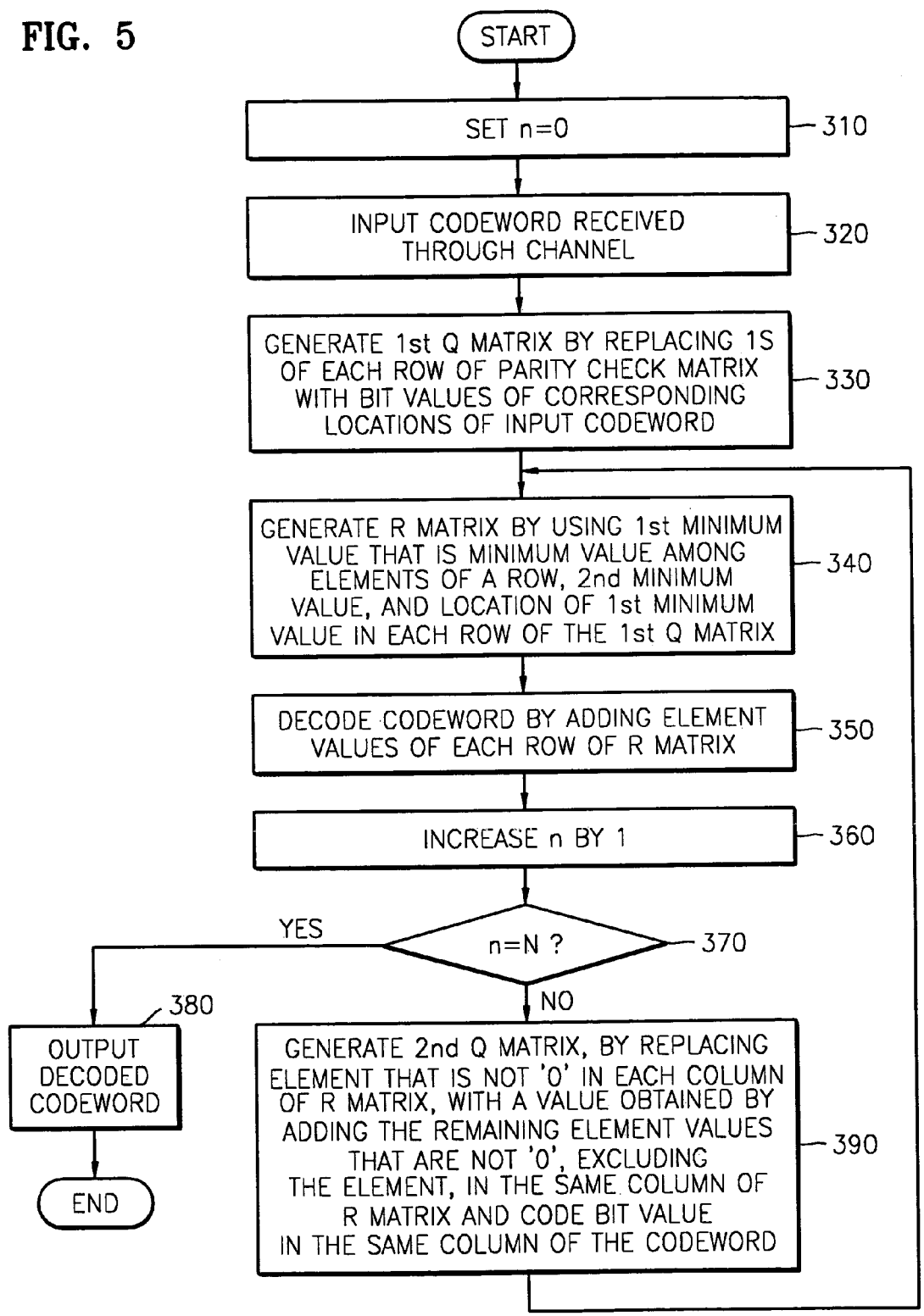
FIG. 5 is a flowchart illustrating an LDCP decoding method performed in the LDPC decoding apparatus, according to an aspect of the present invention shown in FIG. 1.

FIG. 5 is a flowchart illustrating the LDCP decoding method performed in the LDPC decoding apparatus shown in FIG. 1.

At operation 310, the output calculation unit 150 sets an internal variable n to 0.

At operation 320, the first Q matrix generation unit 120 receives the codeword P, which is formed by the c code bits having the soft values by a variety of noises after being transmitted through the channel.

At operation 330, the first Q matrix generation unit 120 compares the codeword P with each of the p rows of the parity check matrix H stored in the parity check matrix storage unit 110, and replaces the element having the value of 1 in each row with the code bit value in a location of the codeword corresponding to the location of the element, and generates the first Q matrix Q.

At operation 340, using the first minimum value that is the minimum value among the elements that are not 0 in each row, using the second minimum value that is the second smallest value in the same row, and using the location of the first minimum value in each row of the first Q matrix Q, the R matrix generation unit 130 replaces an element that is not 0 in the row with a minimum value among the remaining elements that are not 0 in the row excluding the value of the element so that the matrix R is generated.

By determining one code bit by adding the elements of each column of the matrix R provided by the R matrix generation unit 130, at operation 350, the output calculation unit 150 calculates the decoded codeword M formed by the c code bits.

At operation 360, the output calculation unit 150 increases the variable n by 1, and determines whether or not the variable n is a predetermined number N at operation 370, and if the variable n is the predetermined value N, at operation 380, the output calculation unit 150 outputs the decoded codeword M as a final decoded value.

At operation 390, if the variable n is not the predetermined value N, the output calculation unit 150 does not output the decoded codeword M as the final decoded value. Further, the second Q matrix generation unit 140 receives the codeword P and the R matrix R from the R matrix generation unit 130, and replaces each non-zero element in the R matrix with the value obtained by adding all non-zero elements in the column having the non zero element being replaced, except the non zero element that is being replaced, and the element in the same column of the codeword P so that the second Q matrix Q' is generated. The generated second Q matrix Q' is output to the R matrix generation unit 130 and operations 340 through 390 are repeatedly performed until the variable n is the predetermined value N.

Figure 6:
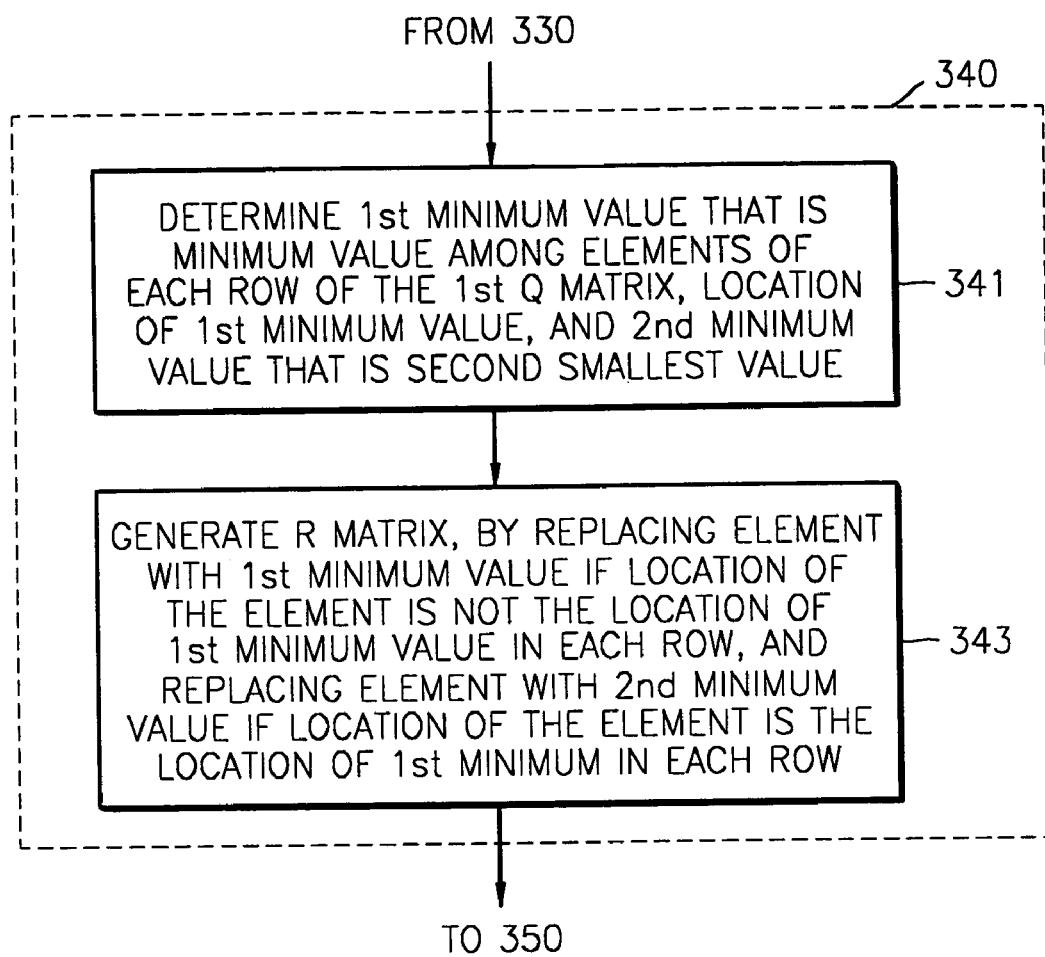
FIG. 6 is a flowchart showing sub-operations of operation 340 shown in FIG. 5.

FIG. 6 is a flowchart showing sub-operations of operation 340 shown in FIG. 5. The matrix element checking unit 131 of the R matrix generation unit 130 receives the first Q matrix Q from the first Q matrix generation unit 120, and, at operation 341, determines the first minimum value that is the minimum value among elements that are not 0 in the row, the second minimum value that is the second smallest value, and the location of the first minimum value in each row of the first Q matrix Q.

The matrix element determination unit 133 receives the first Q matrix Q, and the first minimum value, the location of the first minimum value, and the second minimum value that is the second smallest value, of each row of the first Q matrix Q input from the matrix element checking unit 131. If the location of the element, among the elements that are not 0, of each row of the first Q matrix Q is not the location of the first minimum value, the matrix element determination unit 133 replaces the element with the first minimum value and, if the location of an element is the same as the first minimum value, replaces the element with the second minimum value. At operation 343, the matrix element determination unit 133 then multiplies each element by a predetermined constant so that the matrix R' is generated.

Figure 7:
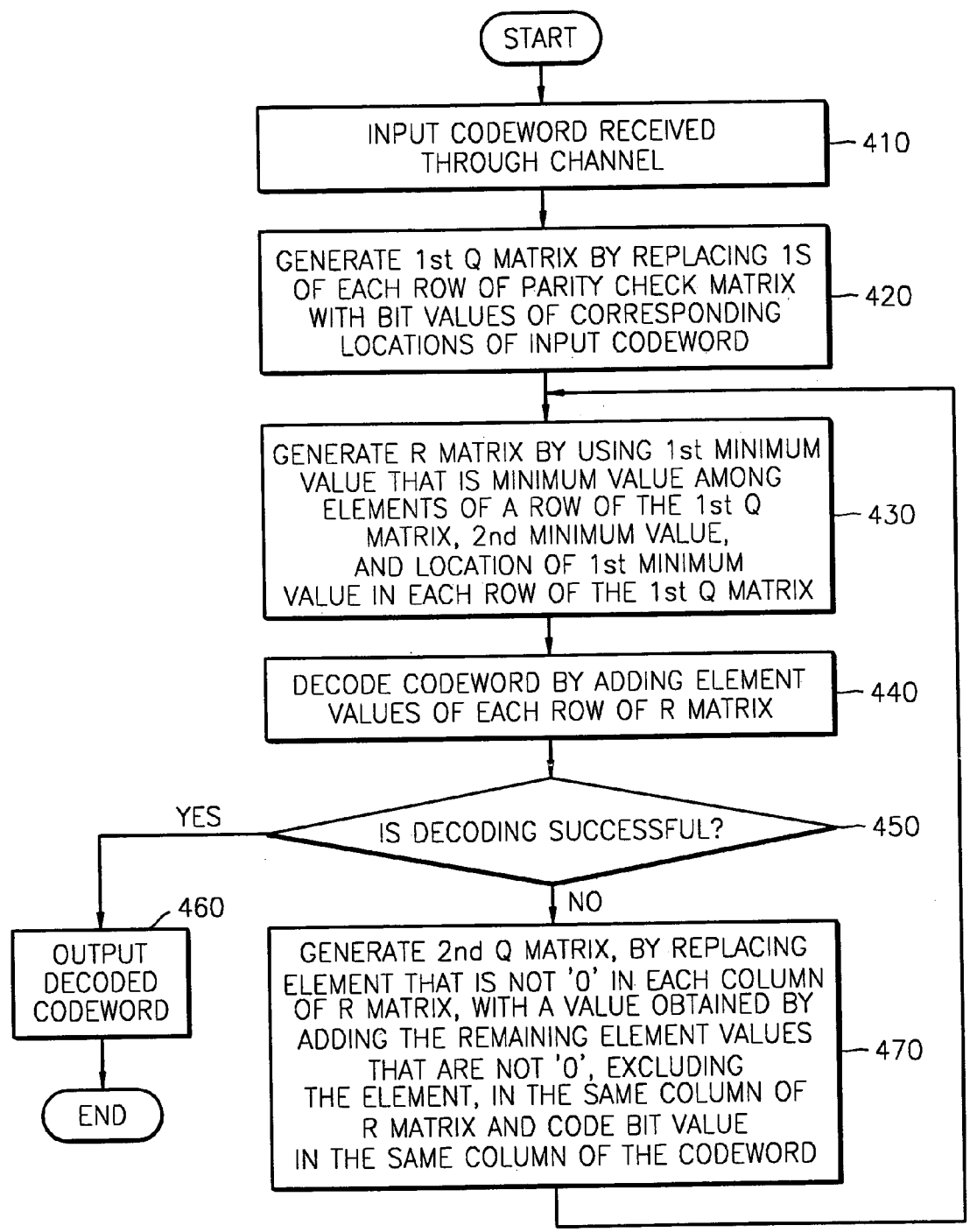
FIG. 7 is a flowchart illustrating the LDPC decoding method performed in the LDPC decoding apparatus, according to another aspect of the present invention, shown in FIG. 4.

FIG. 7 is a flowchart illustrating LDPC decoding method performed in the LDPC decoding apparatus, according to another present invention, shown in FIG. 4.

At operation 410, the first Q matrix generation unit 220 receives the codeword P which is formed by the c code bits having the soft values by the variety of noises after being transmitted through the channel.

At operation 420, the first Q matrix generation unit 220 compares the codeword P with each of the p rows of the parity check matrix H stored in the parity check matrix storage unit 110, and replaces the element having the value 1 in each row with the code bit value in a location of the codeword corresponding to the location of the element, and generates the first Q matrix Q.

At operation 430, using the first minimum value that is the minimum value among the elements that are not 0 in each row, using the second minimum value that is the second smallest value in the same row, and using the location of the first minimum value in each row of the first Q matrix Q, the R matrix generation unit 230 replaces the element that is not 0 in the row with the minimum value among the remaining elements that are not 0 in the row excluding the value of the element so that the R matrix R is generated.

At operation 450, the output determination unit 260 determines whether or not the decoding is successful by using parity check matrix H.

At operation 460, if it is determined that the decoding is successful, the output determination unit 260 outputs the decoded codeword M.

If it is determined that decoding is failed, the output determination unit 260 does not output the decoded codeword and outputs the second Q matrix generation command signal to the second Q matrix generation unit 240. At operation 470, the second Q matrix generation unit 240 receives the codeword P and the matrix R from the R matrix generation unit 230, and replaces each non-zero element in the R matrix with the value obtained by adding all the non-zero elements in the column having the non-zero element being replaced, except the non-zero element which is being replaced, and the element in the same column of the codeword P so that the second Q matrix Q' is generated. The generated second Q matrix Q' is output to the R matrix generation unit 230 and operations 430 through 470 are repeatedly performed until the output determination unit 260 determines that the decoding is successful or until the codeword is decoded by N times, using the predetermined frequency.

The detailed operations of operation 430 shown in FIG. 7 are the same as in FIG. 6.

At operation 341, the R matrix generation unit 230 receives the first Q matrix Q from the first Q matrix generation unit 220, and determines the first minimum value that is the minimum value among elements that are not 0 in the row, the second minimum value that is the second smallest value, and the location of the first minimum value in each row of the first Q matrix Q.

The R matrix generation unit 230 receives the first Q matrix Q, and if the location of an element of each row of the first Q matrix Q is not the location of the first minimum value, at operation 343, the R matrix generation unit 230 replaces the element with the first minimum value. If the location of an element is the same as the first minimum value, the R matrix generation unit 230 replaces the element with the second minimum value, and then multiplies each element by a predetermined constant so that the matrix R' is generated.

The present invention may be embodied in a code, which can be read by a computer, on a computer readable recording medium. The computer readable recording medium includes all kinds of recording apparatuses on which computer readable data are stored.

The computer readable recording media includes storage media such as magnetic storage media (e.g., ROM's, floppy disks, hard disks, etc.), optically readable media (e.g., CD-ROMs, DVDs, etc.) and carrier waves (e.g., transmissions over the Internet). Also, the computer readable recording media can be scattered on computer systems connected through a network and can store and execute a computer readable code in a distributed mode.

As described above, to generate a matrix R in a process of LDPC decoding, unlike conventional systems, which needs multiplication of every elements of a matrix or repeats a process to determine a minimum value by comparing all remaining element values every time to determine an element value in the matrix R, the LDPC decoding apparatus and method, according to an aspect of the present invention, first obtains a first minimum value that is a minimum value among elements that are not 0 in each row, a second minimum value that is a second smallest value in the same row, and a location of the first minimum value and uses these values such that a complexity of operations is reduced and the LDPC decoding performance improves.

Although a few aspects of the present invention have been shown and described, it would be appreciated by those skilled in the art that changes may be made in this aspect without departing from the principles and spirit of the invention, the scope of which is defined in the claims and their equivalents.

What is claimed is:

1. A low density parity code (LDPC) decoding apparatus performing LDPC decoding of a codeword formed by c code bits transmitted through a channel, the apparatus comprising:

a first Q matrix generation unit receiving the codeword and a p×c parity check matrix formed of 0 and 1 values, comprising the codeword with each of p rows of the parity check matrix formed of c elements, replacing the element having a value of 1 in each of the p rows with a code bit value in a location of the codeword corresponding to the location of the c element, and generating a first Q matrix;

an R matrix generation unit receiving the first Q matrix from the first Q matrix generation unit, and by using a first minimum value that is a minimum value among the elements that are not 0 in each row, a second minimum value that is a second minimum value in the same row, and the location of the first minimum value in each row of the first Q matrix, replacing the element that is not 0 in the row with the minimum value, among the remaining elements that are not 0 in the row excluding the value of the element, and generating an R matrix;

a second Q matrix generation unit receiving the codeword and the R matrix from the R matrix generation unit, generating a second Q matrix by replacing each non-zero element in the R matrix with a value obtained by adding all non-zero elements in the column having the non-zero element being replaced, except the non-zero element which is being replaced, and the element in the same column of the codeword, and outputting the second Q matrix to the R matrix generation unit; and an output calculation unit receiving the R matrix from the R matrix generation unit and by determining one code bit by adding elements of each column of the R matrix, outputting a decoded codeword formed by the c code bits, wherein the R matrix generation unit receives the second Q matrix from the second Q matrix generation unit, generates a second R matrix and outputs the second R matrix to the second Q matrix generation unit and the output calculation unit.

2. The LDPC decoding apparatus of claim 1, wherein the R matrix generation unit comprises:

a matrix element checking unit checking the elements that are not 0 in each row of the first Q matrix, and determining the first minimum value, the location of the first minimum value, and the second minimum value; and a matrix element determination unit receiving the first Q matrix, and the first minimum value, the location of the first minimum value, and the second minimum value that is the second smallest value, of each row of the first Q matrix from the matrix element checking unit, wherein if the location is not the location of the first minimum value of the element that is not 0 of each row of the first Q matrix, the matrix element determination unit replaces the element with the first minimum value and, if the location of an element is the same as the first minimum value, replaces the element with the second minimum value, and generates the R matrix.

3. The LDPC decoding apparatus of claim 2, wherein the matrix element checking unit determines the first minimum value and the second minimum value among absolute values of the element values of each row of the first Q matrix.

4. The LDPC decoding apparatus of claim 1, wherein the R matrix generation unit and the second Q matrix generation unit repeatedly perform R matrix generation operations and second Q matrix generation operations, respectively, and the output calculation unit outputs the decoded codeword for the R matrix that is input N-th, wherein N is an integer equal to or greater than 1.

5. The LDPC decoding apparatus of claim 1, further comprising:

a parity check storage unit storing the parity check matrix.

6. An LDPC decoding apparatus performing LDPC decoding of a codeword formed by c code bits having soft values transmitted through a channel, the apparatus comprising:

a first Q matrix generation unit receiving the codeword and a p×c parity check matrix formed of 0 and 1 values, comparing the codeword with each of p rows of the parity check matrix formed by c elements, replacing the element having a value of 1 in each p row with a code bit value in a location of the codeword corresponding to a location of the element, and generating a first Q matrix;

an R matrix generation unit receiving the first Q matrix from the first Q matrix generation unit, and by using a first minimum value that is a minimum value among the elements that are not 0 in each row, a second minimum value that is a second minimum value in the same row, and a location of the first minimum value in each row of the first Q matrix, replacing the element that is not 0 in the row with the minimum value, and generating an R matrix;

an output calculation unit receiving the R matrix from the R matrix generation unit and by determining one code bit by adding elements of each column of the R matrix, outputting a decoded codeword formed by the c code bits;

an output determination unit receiving the decoded codeword from the output calculation unit and determining whether to output the decoded codeword by determining whether the decoding of the decoded codeword is successful using a parity check matrix; and a second Q matrix generation unit, according to a control signal from the output determination unit determining that the decoding failed, receiving the codeword and the R matrix from the R matrix generation unit, generating a second Q matrix by replacing each non-zero element in the R matrix with a value obtained by adding all non-zero elements in a column having the non-zero element being replaced, except the non-zero element that is being replaced, and the element in the same column of the codeword P, and outputting the second Q matrix to the R matrix generation unit, wherein the R matrix generation unit receives the second Q matrix from the second Q matrix generation unit, generates a second R matrix and outputs the second R matrix to the second Q matrix generation unit and the output calculation unit, and the output calculation unit outputs to the output determination unit the codeword decoded using the second R matrix.

7. The LDPC decoding apparatus of claim 6, wherein the R matrix generation unit comprises:

a matrix element checking unit checking the elements that are not 0 in each row of the first Q matrix, and determining the first minimum value, the location of the first minimum value, and the second minimum value; and a matrix element determination unit receiving the first Q matrix, and the first minimum value, the location of the first minimum value, and the second minimum value of each row of the first Q matrix from the matrix element checking unit, wherein if the location is not the location of the first minimum value of the element that is not 0 in each row of the first Q matrix, the matrix element determination unit replaces the element with the first minimum value and, if the location of an element is the same as the first minimum value, replaces the element with the second minimum value, and generates the R matrix.

8. The LDPC decoding apparatus of claim 7, wherein the matrix element checking unit determines the first minimum value and the second minimum value among absolute values of the element values of each row of the first Q matrix.

9. The LDPC decoding apparatus of claim 6, wherein the output determination unit determines that decoding is successful if the following matrix equation is satisfied, and outputs the decoded codeword:

$$H \cdot M = 0$$

where H denotes the p×c parity check matrix, M denotes a column matrix having the elements of the decoded codeword, and 0 is a zero matrix.

10. The LDPC decoding apparatus of claim 9, wherein if decoding is continuously failed as a result of a determination on whether decoding is successful using the R matrix, the output determination unit outputs the decoded codeword that is input N-th, wherein N is an integer equal to or greater than 1.

11. The LDPC decoding apparatus of claim 6, further comprising:

a parity check storage unit storing the parity check matrix.

12. The LDPC decoding apparatus of claim 6, wherein the matrix element determination unit multiplies each element by a predetermined constant to generate the R matrix, and the predetermined constant is determined by $(-1)^{k*}s$, wherein a constant s is a value obtained by multiplying signs of the element values that are not 0 in each row excluding a present element, and k is a value corresponding to a number of the elements that are not 0 in each row.

13. An LDPC decoding method of LDPC decoding a codeword formed by c code bits transmitted through a channel, the method comprising:

receiving the codeword and a p×c parity check matrix formed of 0 and 1 values;

comparing the codeword with each of p rows of the parity check matrix, the rows formed with c elements;

replacing each element having a value of 1 in each p row with a code bit value in a location of the codeword corresponding to the location of the element;

generating a first Q matrix;

replacing each element that is not 0 in the row with a minimum value and generating an R matrix by using a first minimum value that is the minimum value among the elements that are not 0 in each row, a second minimum value that is the second minimum value in the same row, and the location of the first minimum value in each row of the first Q matrix; and outputting a decoded codeword formed by c code bits by determining one code bit by adding elements of each column of the R matrix.

14. The LDPC decoding method of claim 13, wherein the replacing of each element that is not 0 in the row comprises:

checking the elements that are not 0 in each row of the first Q matrix, and determining the first minimum value, the location of the first minimum value, and the second minimum value; and if the location of at least one of the elements that is not 0 of each row of the first Q matrix is not the location of the first minimum value, replacing the at least one of the elements with the first minimum value and, if the location of the at least one of the elements is the same as the first minimum value, replacing the at least one of the elements with the second minimum value and generating the R matrix.

15. The LDPC decoding method of claim 14, wherein in the checking of the elements that are not 0 in each row of the first Q matrix, the first minimum value and the second minimum value are determined among absolute values of the elements of each row of the first Q matrix.

16. The LDPC decoding method of claim 13, further comprising:

generating a second Q matrix by replacing each non-zero element in the R matrix with a value obtained by adding all non-zero elements in a column having the non-zero element being replaced, except the non-zero element that is being replaced, and the element in the same column of the codeword P, and providing the second Q matrix, wherein the replacing of each element that is not 0 in the row, the determining of the one code bit, and the generating of the second Q matrix are performed with a predetermined frequency, and outputting the decoded codeword for the R matrix that is input N-th, wherein N is an integer equal to or greater than 1.

17. An LDPC decoding method of LDPC decoding a codeword formed by c code bits transmitted through a channel, the method comprising:

receiving the codeword and a p×c parity check matrix formed of 0 and 1 values;

comparing the codeword with each of p rows of the parity check matrix, the rows formed with c elements;

replacing each element having a value of 1 in each p row with a code bit value in a location of the codeword corresponding to the location of the element;

generating a first Q matrix;

replacing each element that is not 0 in the row with a minimum value and generating an R matrix by using a first minimum value that is the minimum value among the elements that are not 0 in each row, a second minimum value that is the second minimum value in the same row, and the location of the first minimum value in each row of the first Q matrix;

calculating a decoded codeword formed with c code bits by determining one code bit by adding elements of each column of the R matrix; and determining whether decoding of the decoded codeword is successful using the parity check matrix, and if the decoding is successful, outputting the decoded codeword.

18. The LDPC decoding method of claim 17, wherein the replacing of each element that is not 0 in the row comprises:

checking the elements that are not 0 in each row of the first Q matrix, and determining the first minimum value, the location of the first minimum value, and the second minimum value; and if the location of at least one of the elements that is not 0 of each row of the first Q matrix is not the location of the first minimum value, replacing the at least one of the elements with the first minimum value and, if the location of the at least one of the elements is the same as the first minimum value, replacing the at least one of the elements with the second minimum value and generating the R matrix.

19. The LDPC decoding method of claim 18, wherein in the checking of the elements that are not 0 in each row of the first Q matrix, the first minimum value and the second minimum value are determined among absolute values of the element values of each row of the first Q matrix.

20. The LDPC decoding method of claim 17, further comprising:

if it is determined that the decoding failed, generating a second Q matrix by replacing each non-zero element in the R matrix with a value obtained by adding all non-zero elements in a column having the non-zero element being replaced, except the non-zero element that is being replaced, and the element in the same column of the codeword P, and outputting the second Q matrix.

21. The LDPC decoding method of claim 17, wherein the decoding is successful if the following matrix equation is satisfied and the decoded codeword is output:

$$H \cdot M = 0$$

where H denotes the p×c parity check matrix, M denotes a column matrix having elements of the decoded codeword, and 0 is a zero matrix.

22. The LDPC decoding method of claim 21, wherein in the determination of whether the decoding of the decoded codeword is successful, if decoding continuously failed as a result of the determination of whether the decoding is successful using the R matrix, a decoded codeword that is input N-th, where N is an integer equal to or greater than 1 is output.

23. A computer readable medium having embodied thereon a computer program to perform an LDPC decoding method to LDPC decode a codeword formed by c code bits transmitted through a channel, comprising:

receiving the codeword and a p×c parity check matrix formed of 0 and 1 values;

comparing the codeword with each of p rows of the parity check matrix, the rows formed with c elements;

replacing each element having a value of 1 in each p row with a code bit value in a location of the codeword corresponding to the location of the element;

generating a first Q matrix;

replacing each element that is not 0 in the row with a minimum value and generating an R matrix by using a first minimum value that is the minimum value among the elements that are not 0 in each row, a second minimum value that is the second minimum value in the same row, and the location of the first minimum value in each row of the first Q matrix; and outputting a decoded codeword formed by c code bits by determining one code bit by adding elements of each column of the R matrix.

24. An LDPC decoding method of LDPC decoding a codeword formed by c code bits transmitted through a channel, comprising:

receiving the codeword and a p×c parity check matrix formed of 0 and 1 values;

comparing the codeword with each of p rows of the parity check matrix, the rows formed with c elements;

generating an R matrix by obtaining a first minimum value that is a minimum value among elements that are not 0 in each row, a second minimum value that is a second smallest value in the same row, and a location of the first minimum value; and outputting a decoded codeword formed by c code bits by determining one code bit by adding elements of each column of the R matrix.

25. The LDPC decoding method of claim 24, further comprising:

replacing each element having a value of 1 in each p row with a code bit value in a location of the codeword corresponding to the location of the element;

replacing each element that is not 0 in the row with the minimum value among the remaining elements that are not 0 in the row; and generating a first Q matrix, wherein the location of the first minimum value in each row is of the first Q matrix.

26. The LDPC decoding method of claim 25, further comprising:

checking the elements that are not 0 in each row of the first Q matrix, and determining the first minimum value, the location of the first minimum value, and the second minimum value; and if the location of at least one of the elements that is not 0 of each row of the first Q matrix is not the location of the first minimum value, replacing the element with the first minimum value and, if the location of an element is the same as the first minimum value, replacing the element with the second minimum value and generating the R matrix.

27. The LDPC decoding method of claim 25, further comprising:

generating a second Q matrix by replacing each non-zero element in the R matrix with a value obtained by adding all non-zero elements in a column having the non-zero element being replaced, except the non-zero element that is being replaced, and the element in the same column of the codeword P, and providing the second Q matrix, wherein the replacing of the element, the determining of the one code bit, and the generating of the second Q matrix are performed with a predetermined frequency, and outputting the decoded codeword for an R matrix that is input N-th, wherein N is an integer equal to or greater than 1.

28. The LDPC decoding method of claim 25, wherein in the replacing of the at least one of the elements that is not 0 in the row the first minimum value and the second minimum value are determined among absolute values of the elements of each row of the first Q matrix.

* * * * *